United States Patent
Yang et al.

(10) Patent No.: US 12,352,501 B1
(45) Date of Patent: Jul. 8, 2025

(54) RADIATORS AND IMMERSION TANKS USING THE SAME

(71) Applicants: Industrial Technology Research Institute, Hsinchu (TW); KENMEC MECHANICAL ENGINEERING CO., LTD., Taipei (TW)

(72) Inventors: Shu-Jung Yang, New Taipei (TW); Chih-Yao Wang, Hsinchu County (TW); Heng-Chieh Chien, New Taipei (TW); Kuei-Yuan Huang, New Taipei (TW); Yu-Long Lu, New Taipei (TW)

(73) Assignees: Industrial Technology Research Institute, Hsinchu (TW); KENMEC MECHANICAL ENGINEERING CO., LTD., Taipei (TW)

( * ) Notice: Subject to any disclaimer, the term of this patent is extended or adjusted under 35 U.S.C. 154(b) by 38 days.

(21) Appl. No.: 18/398,151

(22) Filed: Dec. 28, 2023

(51) Int. Cl.
*F28D 1/04* (2006.01)

(52) U.S. Cl.
CPC ................. *F28D 1/0461* (2013.01)

(58) Field of Classification Search
CPC .............. F28D 1/0461; H05K 7/20236; H05K 7/20781
USPC ....................................................... 165/143
See application file for complete search history.

(56) References Cited

U.S. PATENT DOCUMENTS

| | | | |
|---|---|---|---|
| 9,713,286 B2 * | 7/2017 | Chainer | H05K 7/20336 |
| 10,321,609 B2 | 6/2019 | Hirai et al. | |
| 2008/0141875 A1 * | 6/2008 | Fahrenback | H01G 2/08 100/341 |
| 2016/0019990 A1 * | 1/2016 | Mochizuki | G21F 5/10 376/299 |
| 2016/0073548 A1 * | 3/2016 | Wei | H05K 7/203 165/104.21 |
| 2016/0262288 A1 * | 9/2016 | Chainer | F28D 15/0266 |
| 2017/0064862 A1 * | 3/2017 | Miyoshi | H01L 23/32 |

(Continued)

FOREIGN PATENT DOCUMENTS

| | | |
|---|---|---|
| CN | 113133271 | 7/2021 |
| CN | 115707217 | 2/2023 |

(Continued)

OTHER PUBLICATIONS

"Office Action of Taiwan Counterpart Application", issued on Sep. 4, 2024, p. 1-p. 12.

(Continued)

*Primary Examiner* — Jon T. Schermerhorn, Jr.
(74) *Attorney, Agent, or Firm* — JCIPRNET

(57) ABSTRACT

A radiator and an immersion tank using the radiator is provided. The immersion tank includes a first condensation tank and the radiator. Multiple motherboards and a first working fluid are located in the first condensation tank. The radiator includes a condensation assembly and multiple heat exchanger parts. The condensation assembly is assembled outside the first condensation tank along a first direction, wherein the condensation assembly has a second condensation tank, and the second working fluid flows through the second condensation tank. Each heat exchanger part extends along the first direction, a first end of the heat exchanger part is plugged into the first condensation tank, and a second end of each heat exchanger part is plugged into the condensation assembly.

32 Claims, 13 Drawing Sheets

(56) References Cited

U.S. PATENT DOCUMENTS

| | | | |
|---|---|---|---|
| 2018/0042138 A1* | 2/2018 | Campbell | H05K 7/203 |
| 2023/0147067 A1 | 5/2023 | Kandlikar et al. | |

FOREIGN PATENT DOCUMENTS

| | | |
|---|---|---|
| TW | 201601444 | 1/2016 |
| TW | 201727178 | 8/2017 |
| TW | 202202034 | 1/2022 |
| TW | 202301962 | 1/2023 |
| TW | 202307386 | 2/2023 |
| TW | 202315853 | 4/2023 |

OTHER PUBLICATIONS

Guohui Zhou et al., "A two-phase liquid immersion cooling strategy utilizing vapor chamber heat spreader for data center servers", Applied Thermal Engineering, Feb. 28, 2022, pp. 1-10, Issue 210.

Yuhao Luo et al., "A novel composite vapor chamber for battery thermal management system", Energy Conversion and Management, Feb. 2, 2022, pp. 1-15, Issue 254.

Phillip E. Tuma, "The Merits of Open Bath Immersion Cooling of Datacom Equipment", 26th IEEE Semi-Therm Symposium, Apr. 8, 2010, pp. 1-9.

\* cited by examiner

RADIATORS AND IMMERSION TANKS USING THE SAME

TECHNICAL FIELD

The disclosure relates to a radiator and an immersion tank, and in particular to a radiator and an immersion tank with good heat dissipation effect.

DESCRIPTION OF RELATED ART

With the advent of the artificial intelligence (AI) and 5G era, the high-computing power system with high performance computing (HPC) has begun to flourish. The power consumption of the central processing unit (CPU) and the graphics processing unit (GPU) used in the high-computing power system has increased rapidly. Currently, chips above 400 W are already popularized, and the maximum power consumption of chips will be around 1000 W in the future.

Heat dissipation of the chips above 400 W is currently a developing field in the industry, while two-phase immersion cooling is usually one of the few solutions for heat dissipation of the chips above 1000 W level.

The appeal of the two-phase immersion cooling is "ultra-high heat dissipation capability" and "power usage effectiveness (PUE)".

The condensation heat exchanger is one of the main sources of cooling energy consumption, so improving the performance of the condensation heat exchanger can further enhance the power usage effectiveness of the two-phase immersion cooling system.

The condensation heat exchangers in the commonly used immersion cooling architecture are mostly coil heat exchangers, finned tube heat exchangers, or plate heat exchangers. The condensation performance of the condensation exchangers is acceptable, but due to the shapes thereof, the pressure loss of the cooling water in the tubes is relatively large, and the condensation exchangers need to be driven by pumps with relatively large horsepower, resulting in relatively large cooling energy consumption, which is not conducive to improving the power usage effectiveness and the heat exchange performance.

SUMMARY

The disclosure provides a radiator with good heat dissipation effect.

The disclosure provides a working immersion tank, which can exchange large amounts of heat.

A radiator of the disclosure is adapted to be assembled in a first condensation tank of an immersion tank along a first direction. The radiator includes a condensation assembly and multiple heat exchanger parts. The condensation assembly has a second condensation tank, and a working fluid flows through the second condensation tank. Each heat exchanger part extends along the first direction, a first end of each heat exchanger part is adapted to be plugged into the first condensation tank, and a second end of each heat exchanger part is plugged into the condensation assembly.

An immersion tank of the disclosure includes a first condensation tank and the radiator. Multiple motherboards and a first working fluid are located in the first condensation tank, and a condensation assembly of the radiator is assembled outside the first condensation tank along the first direction. The condensation assembly has a second condensation tank, and the second working fluid flows through the second condensation tank. A first end of each heat exchanger part of the radiator is plugged into the first condensation tank, and a second end of each heat exchanger part is plugged into the condensation assembly.

In an embodiment, the first working fluid is a dielectric liquid and the second working fluid is water.

In an embodiment, a boiling point of the first working fluid is between 20 and 80 degrees Celsius.

In an embodiment, the condensation assembly further includes a pump and a cooling pipeline. The second condensation tank is connected to the cooling pipeline, and the pump is connected to the cooling pipeline.

In an embodiment, the condensation assembly further includes a vapor chamber (VC) cooling plate, and the heat exchanger parts are plugged into the vapor chamber cooling plate.

In an embodiment, the vapor chamber cooling plate is a tank bottom of the second condensation tank.

In an embodiment, the condensation assembly further includes a vapor chamber cooling plate, and the first ends or the second ends of the heat exchanger parts are integrally formed with the vapor chamber cooling plate.

In an embodiment, the vapor chamber cooling plate is disposed between the first condensation tank and the second condensation tank.

In an embodiment, the heat exchanger part includes a heat pipe, a vapor chamber plate, or a high thermal conductivity metal.

In an embodiment, the radiator further includes multiple fins, a normal direction of the fins is parallel to the first direction, and the heat exchanger parts are disposed passing through the fins.

In an embodiment, the heat exchanger parts are arranged at ordered intervals or misaligned with each other.

In an embodiment, the radiator further includes a sprinkler head disposed above the second condensation tank, and the sprinkler head sprays the second working fluid at the second end from above the heat exchanger part.

In an embodiment, the sleeve members have surface roughness.

In an embodiment, the radiator further includes multiple sleeve members disposed in the second condensation tank, and the second ends of the heat exchanger parts are sleeved into the corresponding sleeve members.

In an embodiment, the radiator further includes a thermal interface material disposed between the sleeve member and the heat exchanger part sleeved with each other.

In an embodiment, the radiator further includes multiple fixing rings, and the heat exchanger parts pass through the corresponding fixing rings to be fixed to the second condensation tank.

In an embodiment, the radiator further includes multiple water film disturbers, and the water film disturbers are distributed on the corresponding heat exchanger parts along the first direction.

Based on the above, in the radiator and the immersion tank using the radiator of the disclosure, a large amount of heat exchange work between systems can be performed by the boiling/evaporation behavior of the first working fluid together with the extremely high heat conduction efficiency of the heat exchanger part, so a dense pipeline is not required.

DESCRIPTION OF THE EMBODIMENTS

Figure 1:
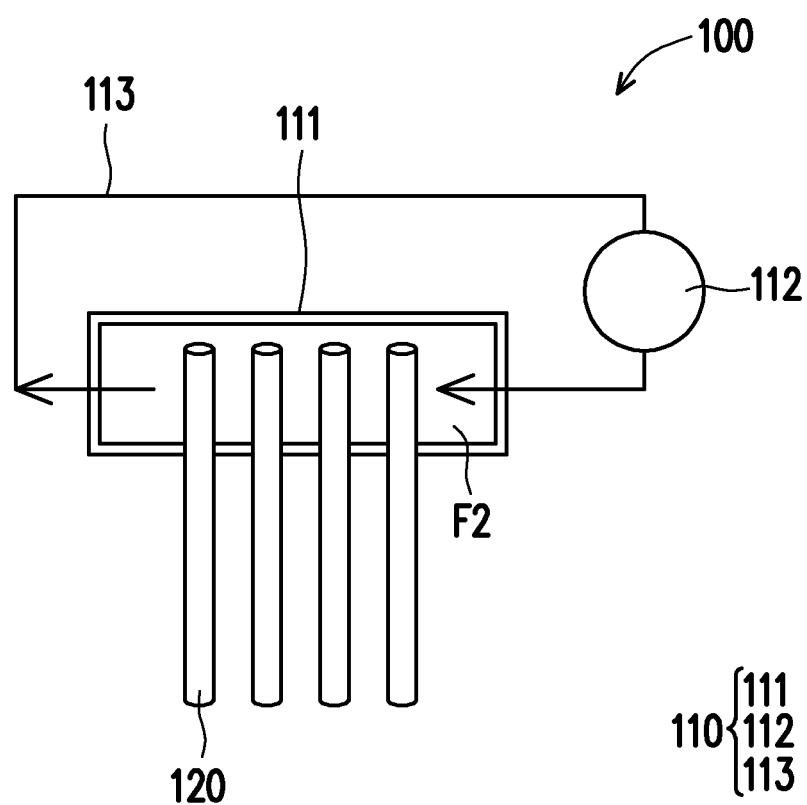
FIG. 1 is a schematic view of a radiator according to an embodiment of the disclosure.
Figure 2A:
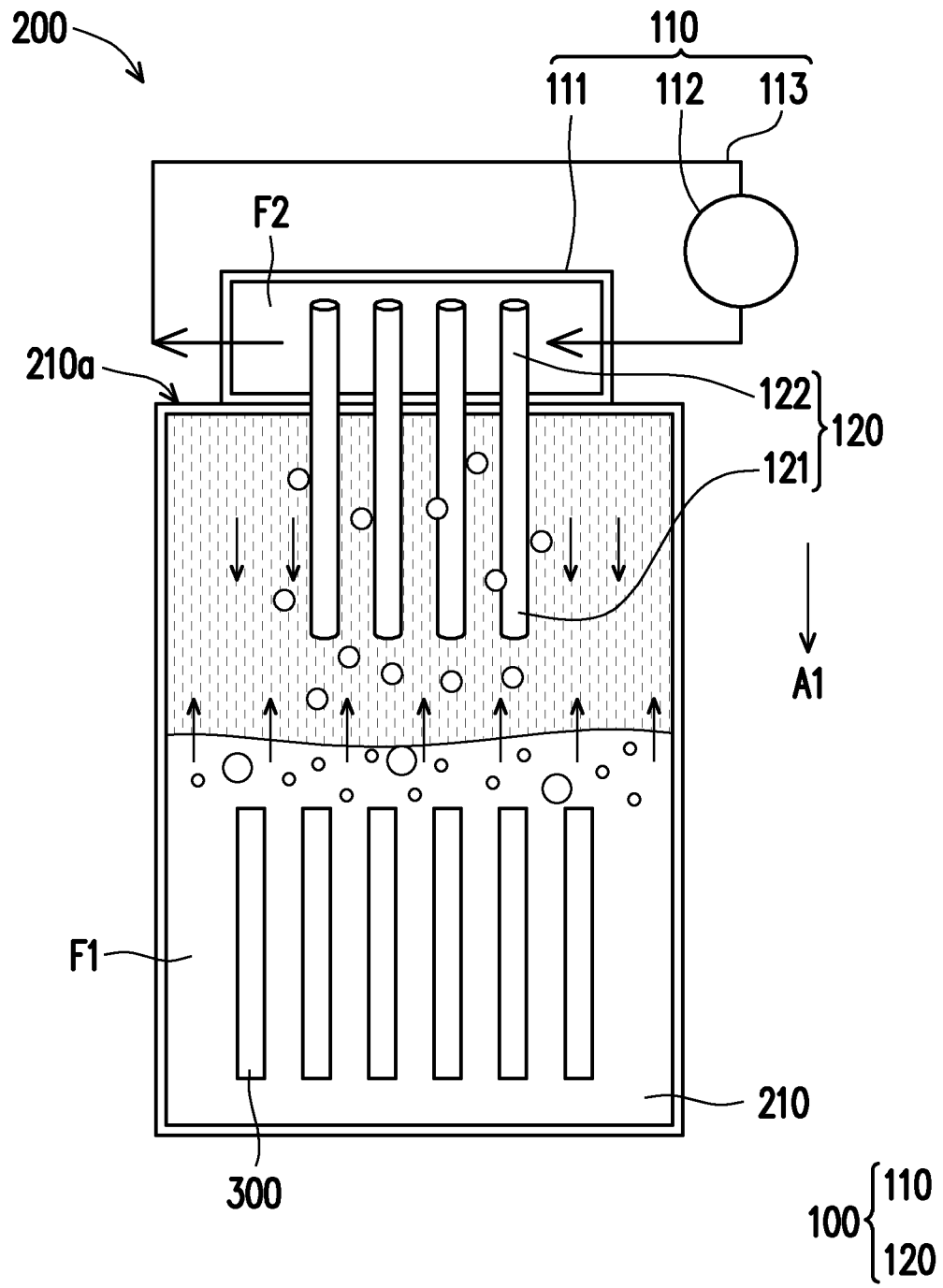
FIG. 2A is a schematic view of applying the radiator of FIG. 1 in an immersion tank.
Figure 2B:
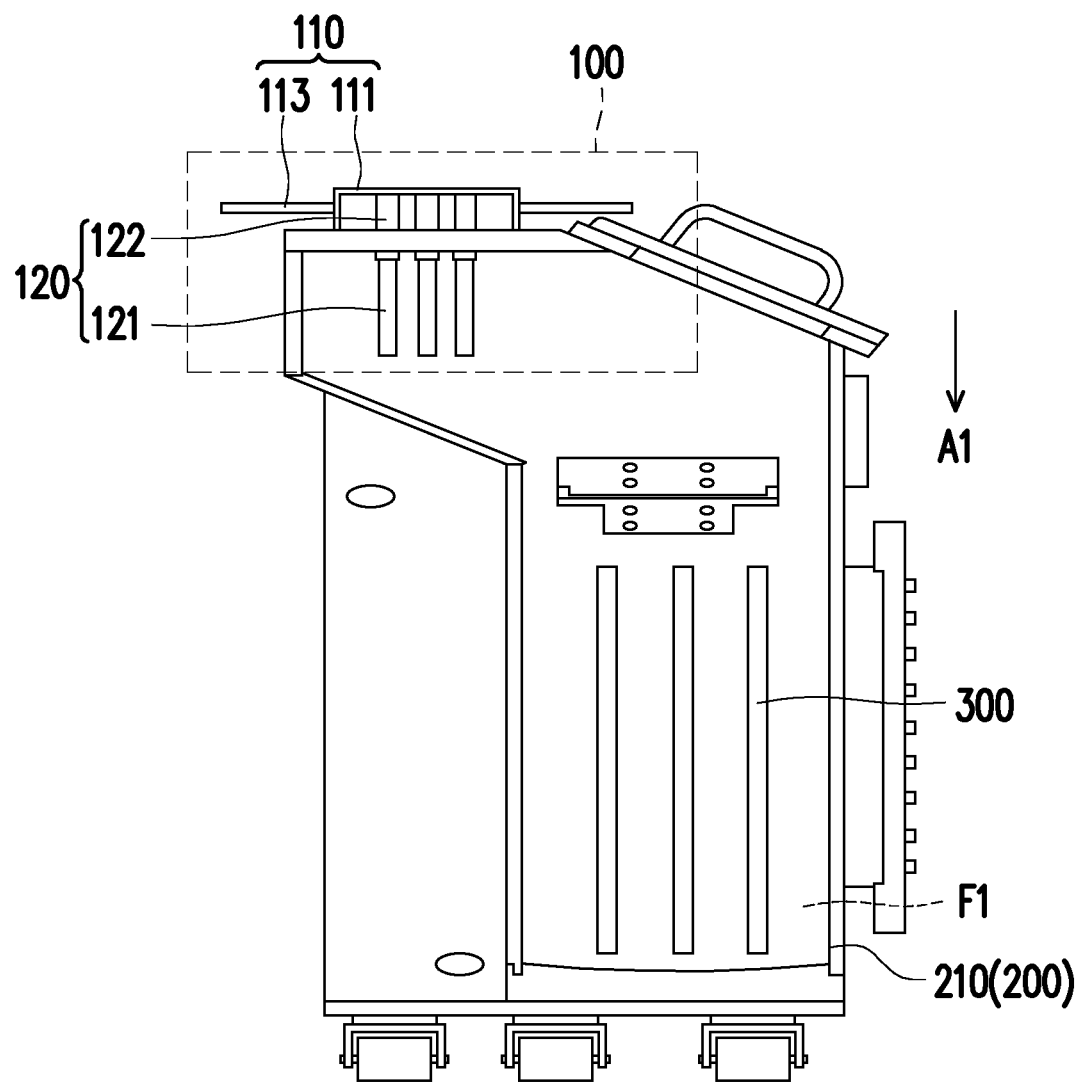
FIG. 2B is a three-dimensional schematic view of FIG. 2A.

FIG. 1 is a schematic view of a radiator according to an embodiment of the disclosure, FIG. 2A is a schematic view of applying the radiator of FIG. 1 in an immersion tank, and FIG. 2B is a three-dimensional schematic view of FIG. 2A.

Please refer to FIG. 1, FIG. 2A, and FIG. 2B at the same time. An immersion tank 200 of the embodiment includes a first condensation tank 210 and a radiator 100, wherein multiple motherboards 300 of a server and a first working fluid F1 are located in the first condensation tank 210, and the motherboards 300 are immersed in the first working fluid F1. The motherboard 300 may be a printed circuit board (PCB), and each motherboard 300 has multiple chips that generate high heat due to operation. The radiator 100 is assembled to the first condensation tank 210 along a first direction A1. More specifically, the radiator 100 may be assembled above the first condensation tank 210. The radiator 100 of the embodiment includes a condensation assembly 110 and multiple heat exchanger parts 120. The condensation assembly 110 includes a second condensation tank 111, a pump 112, and a cooling pipeline 113, wherein the second condensation tank 111 is connected to the cooling pipeline 113, the pump 112 is connected to the cooling pipeline 113, and a second working fluid F2 flows in the cooling pipeline 113 and the second condensation tank 111 via an operation of the pump 112. Each heat exchanger part 120 extends along the first direction A1, wherein a first end 121 of each heat exchanger part 120 is plugged into the first condensation tank 210 for heat exchange, and a second end 122 of each heat exchanger part 120 is plugged into the condensation assembly 110.

The first working fluid F1 is a dielectric liquid with a boiling point between 20 and 80 degrees Celsius, and the second working fluid F2 is water.

An operation of the immersion tank 200 is described in detail below.

Heat emitted by electronic components on the motherboard 300 placed in the first condensation tank 210 of the immersion tank 200 heats the first working fluid F1, so that the first working fluid F1 evaporates into steam, wherein the steam flows upward and exchanges heat with the first end 121 of the heat exchanger part 120 inserted into the first condensation tank 210 from above.

The operation of the pump 112 enables the second working fluid F2 to flow into the second condensation tank 111 from the cooling pipeline 113, contact the second end 122 of the heat exchanger part 120, and then flow out of the second condensation tank 111. Through the heat exchange and circulation flow of the second working fluid F2, the heat conducted from the first end 121 of the heat exchanger part 120 is transferred to the outside of the second condensation tank 111 for heat dissipation. Therefore, the heat exchanger part 120 is converted into a phase change with a lower temperature via the release of energy, the steam of the first working fluid F1 contacting the first end 121 condenses into liquid droplets on a surface of the heat exchanger part 120 due to the low temperature, and the liquid droplets drip back into the first working fluid F1 below.

Compared with the coil, finned tube, or plate heat exchanger used in the prior art, a column-shaped heat pipe is selected as the heat exchanger part 120 in the embodiment. Since the heat pipe has excellent heat conduction capability and has a simple shape and structure to reduce the uneven performance caused by a large temperature difference between front and rear ends of coil and finned tube pipelines, etc., high-performance heat exchange can be performed between both ends of the heat exchanger part 120 and the radiator 100 and the condensation tank 210, thereby improving the overall heat dissipation effect of the radiator 100 and the immersion tank 200.

In addition, since the shape of the heat pipe is relatively simple, the heat pipe may be directly plugged into the first condensation tank 210, so the assembly manner is relatively simple. Furthermore, a single heat pipe is used as the heat exchanger part 120. If the heat exchanger part 120 is damaged, malfunctions, or needs repair, only a single heat pipe needs to be replaced without replacing the entire radiator 100, which saves cost.

Figure 3:
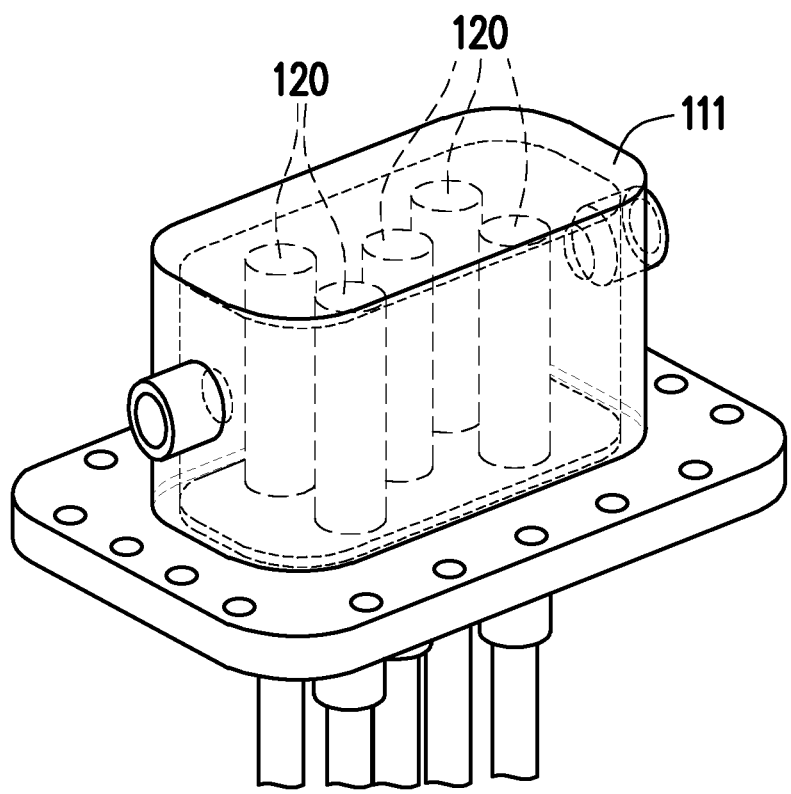
FIG. 3 is a three-dimensional schematic view of a radiator.

FIG. 3 is a three-dimensional schematic view of a radiator. Please refer to FIG. 3. In the example shown in the embodiment, the number of the heat exchanger parts 120 is 5, wherein four of the heat exchanger parts 120 form a rectangle, and one heat exchanger part 120 is located at the center point of the rectangle formed by the four heat exchanger parts 120 to form a staggered arrangement. The usage number and the arrangement manner of the heat exchanger parts 120 may be selected according to actual requirements and design, and are not limited to the usage number and the arrangement manner exemplified in the embodiment. Specifically, the usage number of the heat exchanger parts 120 is affected by factors such as the size of the first condensation tank 210, the size of the second condensation tank 111, and the size of the heat exchanger part 120, heat emitted by a heat source on the motherboard 300, and the selection of the first working fluid F1 and the second working fluid F2.

Other implementation variations of the radiator 100 will be described below.

Figure 4A:
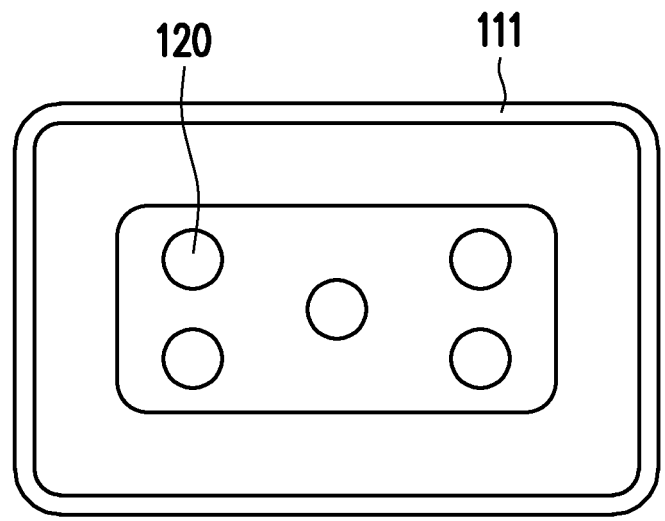
FIG. 4A is a schematic view of heat exchanger parts arranged at ordered intervals.
Figure 4B:
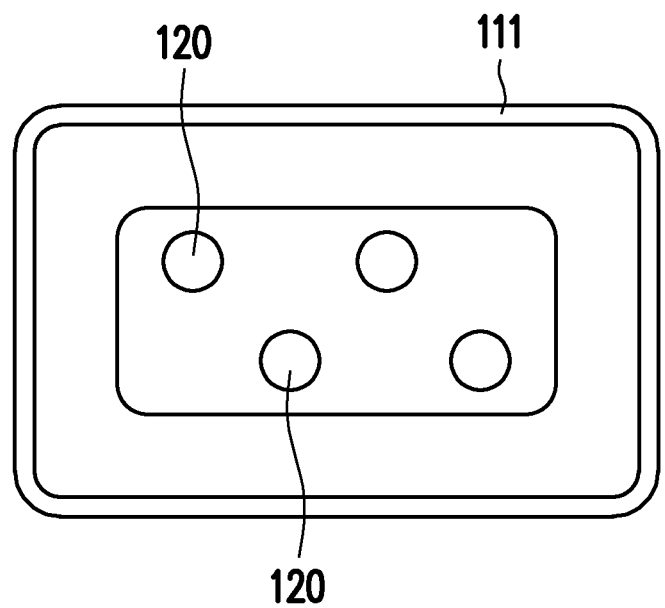
FIG. 4B is a schematic view of heat exchanger parts misaligned with each other.

FIG. 4A is a schematic view of the heat exchanger parts 120 arranged at ordered intervals, and FIG. 4B is a schematic view of the heat exchanger parts 120 misaligned with each other. As shown in FIG. 4A, the heat exchanger parts 120 may be arranged in such a manner that four of the heat exchanger parts 120 form a rectangle and one heat exchanger part 120 is located at the center point of the rectangle formed by the four heat exchanger parts 120, wherein the four heat exchanger parts 120 forming the rectangle are orderly arranged at intervals with the same distance in pairs. Alternatively, as shown in FIG. 4B, the heat exchanger parts 120 may also be misaligned with each other, wherein the spacing between any two adjacent heat exchanger parts 120 may be the same or different. Specifically, the arrangement manner of the heat exchanger parts 120 may be changed according to actual heat dissipation requirements.

Figure 5:
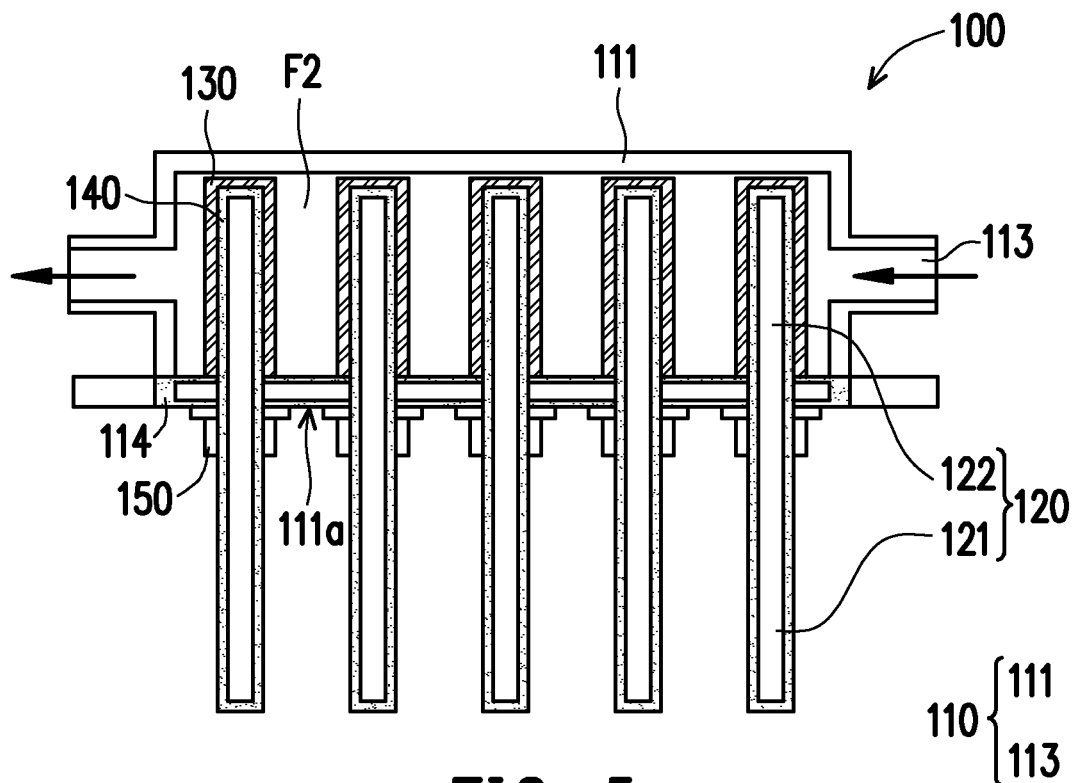
FIG. 5 is a schematic view of a second condensation tank using a vapor chamber cooling plate as a tank bottom.

FIG. 5 is a schematic view of a second condensation tank using a vapor chamber cooling plate as a tank bottom. Please refer to FIG. 2A, FIG. 2B, and FIG. 5 at the same time. In the embodiment of FIG. 5, a vapor chamber cooling plate 114 may be used at a tank bottom of the second condensation tank 111, and the heat exchanger parts 120 are plugged into the vapor chamber cooling plate 114. Specifically, the tank bottom of the second condensation tank 111 may have an open opening, and the vapor chamber cooling plate 114 is assembled to the second condensation tank 111 and closes the opening to serve as a tank bottom portion of the second condensation tank 111. Through an open opening also on a tank top surface 210*a* of the first condensation tank 210 and with the same size as the vapor chamber cooling plate 114, the second condensation tank 111 equipped with the vapor chamber cooling plate 114 is assembled. Such an exemplary architecture enables the rising steam flowing in the first condensation tank 210 to directly exchanges heat with the vapor chamber cooling plate 114 over a larger area, and the conversion efficiency is further improved.

Figure 6:
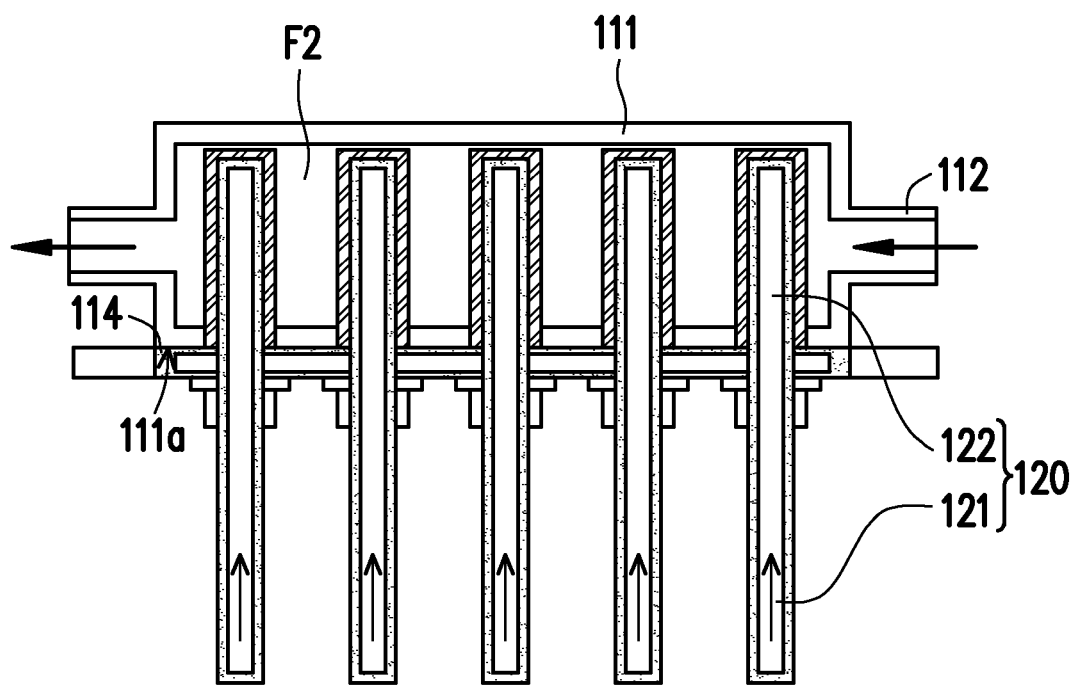
FIG. 6 is a schematic view of a vapor chamber cooling plate applied between a first condensation tank and a second condensation tank.

FIG. 6 is a schematic view of a vapor chamber cooling plate applied between a first condensation tank and a second condensation tank. Please refer to FIG. 2A, FIG. 2B, and FIG. 6 at the same time. In another embodiment, the vapor chamber cooling plate 114 may be disposed between the first condensation tank 210 and the second condensation tank 111, and the heat exchanger parts 120 are plugged into the vapor chamber cooling plate 114.

Specifically, the vapor chamber cooling plate 114 is directly assembled to a tank bottom surface 111*a* of the second condensation tank 111, and another surface of the vapor chamber cooling plate 114 may contact a tank top surface 210*a* of the first condensation tank 210. A surface of the vapor chamber cooling plate 114 close to the second condensation tank 111 may be extended and designed with heat dissipation fins or bumps, which are not shown in the drawings.

As shown in the embodiments of FIG. 5 and FIG. 6, the heat transferred from the heat exchanger part 120 may be evenly diffused through the use of the vapor chamber cooling plate 114, effectively improving the overall heat dissipation effect of the radiator 100. The vapor chamber cooling plate 114 may be a heat pipe part, which has a cavity. The cavity may be filled with a phase change working fluid.

Please continue to refer to FIG. 5. The radiator 100 further includes multiple sleeve members 130 disposed in the second condensation tank 111, and the second ends 122 of the heat exchanger parts 120 are sleeved into the corresponding sleeve members 130. The configuration of the sleeve members 130 is conducive to further stabilizing the heat exchanger parts 120 in the second condensation tank 111 and also serves as a protective mechanism to prevent the second working fluid F2 from leaking along the heat exchanger parts 120 and seeping into the first condensation tank 210. In addition, an outer surface of the sleeve member 130 may be made with concave and convex structures according to requirements, so that the fluid flowing through the outer surface of the sleeve member 130 is disturbed to enhance the heat exchange capability.

In an embodiment, a thermal interface material TIM (for example, a thermal interface material paste) 140 may be disposed between the sleeve member 130 and the heat exchanger part 120 that are sleeved with each other to contact the heat exchanger part 120 and the sleeve member 130 together.

In addition, the radiator 100 further includes multiple fixing rings 150, wherein the fixing rings 150 are disposed on the tank bottom surface 111*a* of the second condensation tank 111 facing a tank top of the first condensation tank 210, and the heat exchanger parts 120 pass through the corresponding fixing rings 150 to be fixed to the second condensation tank 111.

Figure 7:
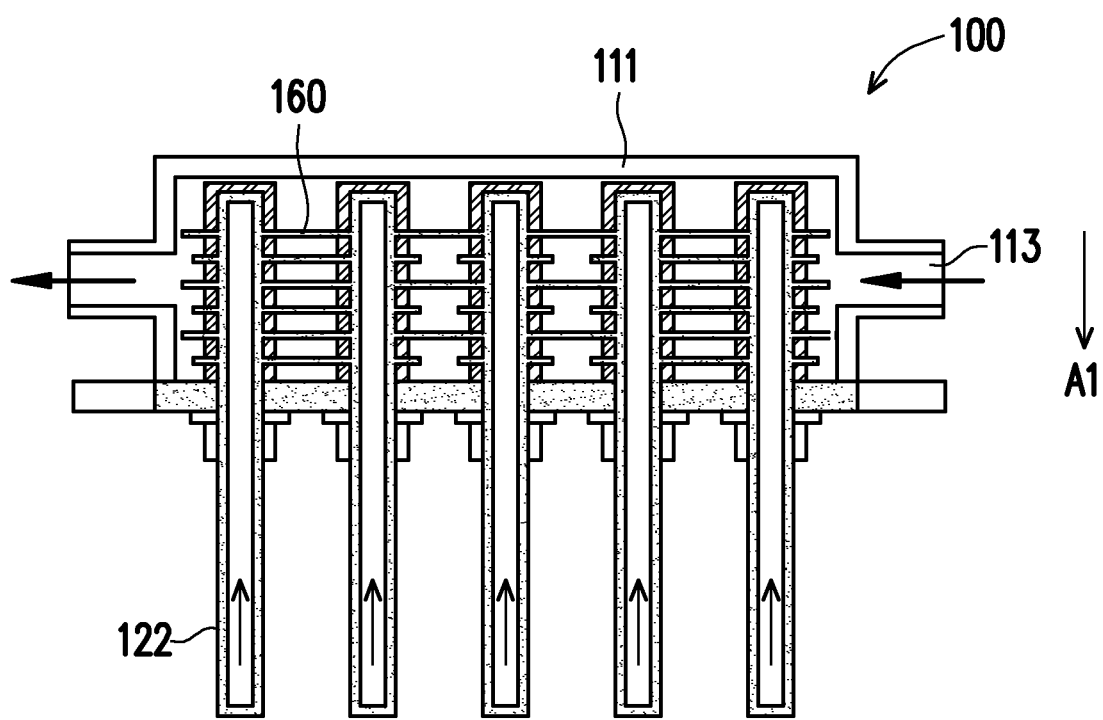
FIG. 7 is a schematic view of multiple fins applied in a radiator.

FIG. 7 is a schematic view of multiple fins applied in the radiator 100. As shown in FIG. 7, the radiator 100 further includes multiple fins 160 sleeved onto the heat exchanger parts 120, wherein a normal direction of the fins 160 is parallel to the first direction A1, and the lengths of the fins 160 may be configured with long and short ends according to a water flow at an inlet of the cooling pipeline 113, which is conducive for the working fluid F2 to enter the fins for contact. The configuration of the fins 160 is conducive to improving the contact between the fluid inside the second condensation tank 111 and the fins 160, thereby improving the overall heat dissipation effect of the radiator 100.

Figure 8A:
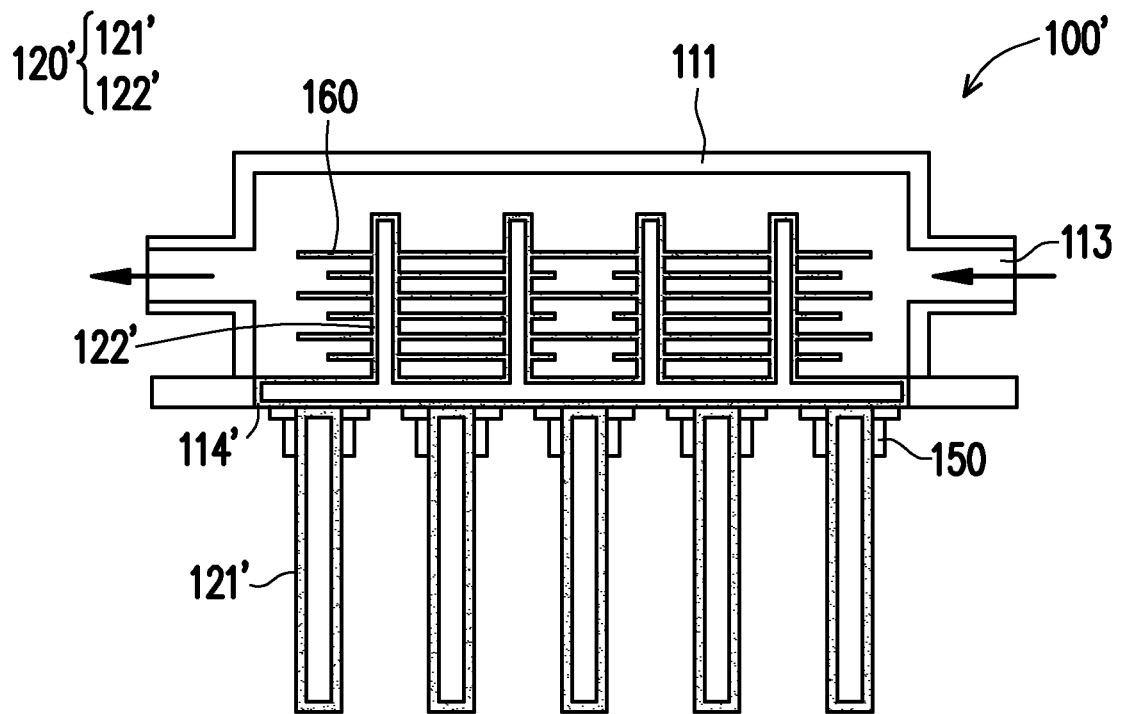
FIG. 8A is a schematic view of a radiator according to another embodiment.

FIG. 8A is a schematic view of a radiator according to another embodiment. As shown in FIG. 8A, the difference between the embodiment and the foregoing embodiment is that a heat exchanger part 120' includes two portions, wherein the portion with a second end 122' inserted into the second condensation tank 111 is integrally formed with a vapor chamber cooling plate 114', and the portion with a first end 121' is fixed to the tank bottom of the second condensation tank 111 by the fixing ring 150 and contacts the vapor chamber cooling plate 114'. The heat dissipation fin 160 is disposed on the heat exchanger part 120'.

Figure 8B:
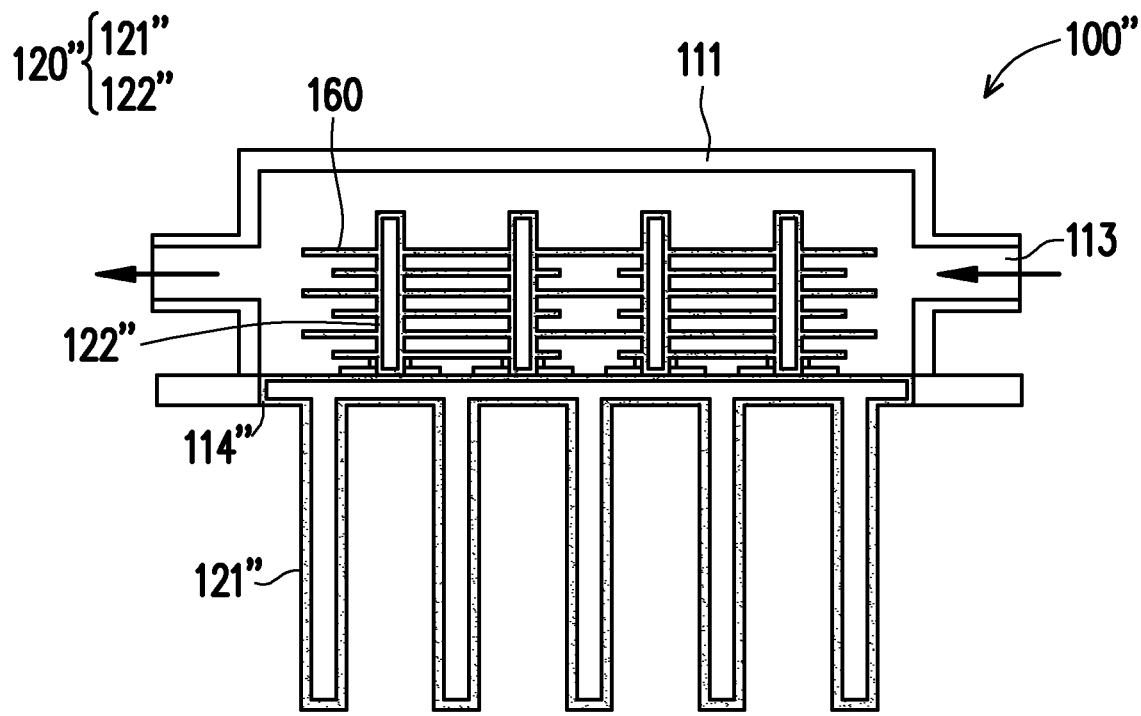
FIG. 8B is another variation of the radiator of FIG. 8A.
Figure 8C:
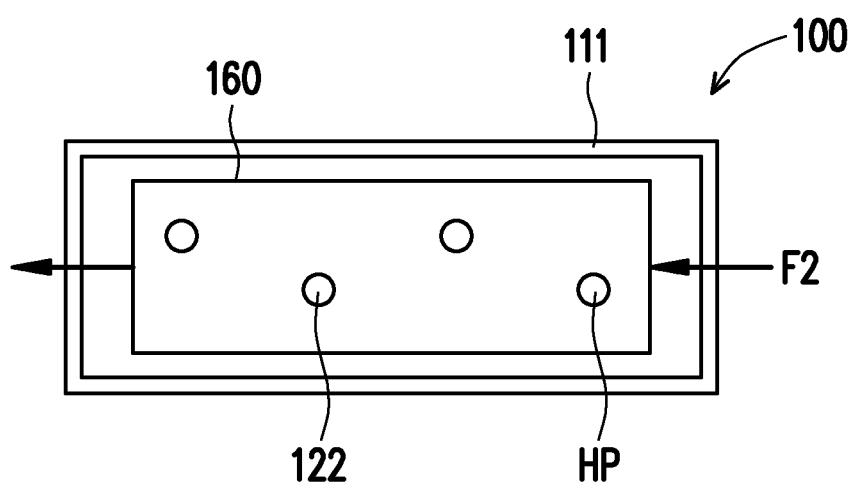
FIG. 8C is a top view of FIG. 8A and FIG. 8B.

FIG. 8B is another variation of the radiator of FIG. 8A. Please refer to FIG. 8B. Different from the embodiment of FIG. 8A, in a radiator 100" shown in FIG. 8B, a portion of a heat exchanger part 120" integrally formed with a vapor chamber cooling plate 114" has a first end 121" inserted into the first condensation tank 210 (shown in FIG. 2A). The heat dissipation fin 160 is disposed on the heat exchanger part 120". FIG. 8C is a top view of FIG. 8A and FIG. 8B. It can be seen from FIG. 8A, FIG. 8B, and FIG. 8C that the number of the first ends 121' and 121" of the heat exchanger part 120 located in the first condensation tank 210 (shown in FIG. 2A) may be different from the number of the second ends 122' and 122" inserted into the second condensation tank 111 and may be increased or decreased according to heat dissipation requirements.

Figure 9A:
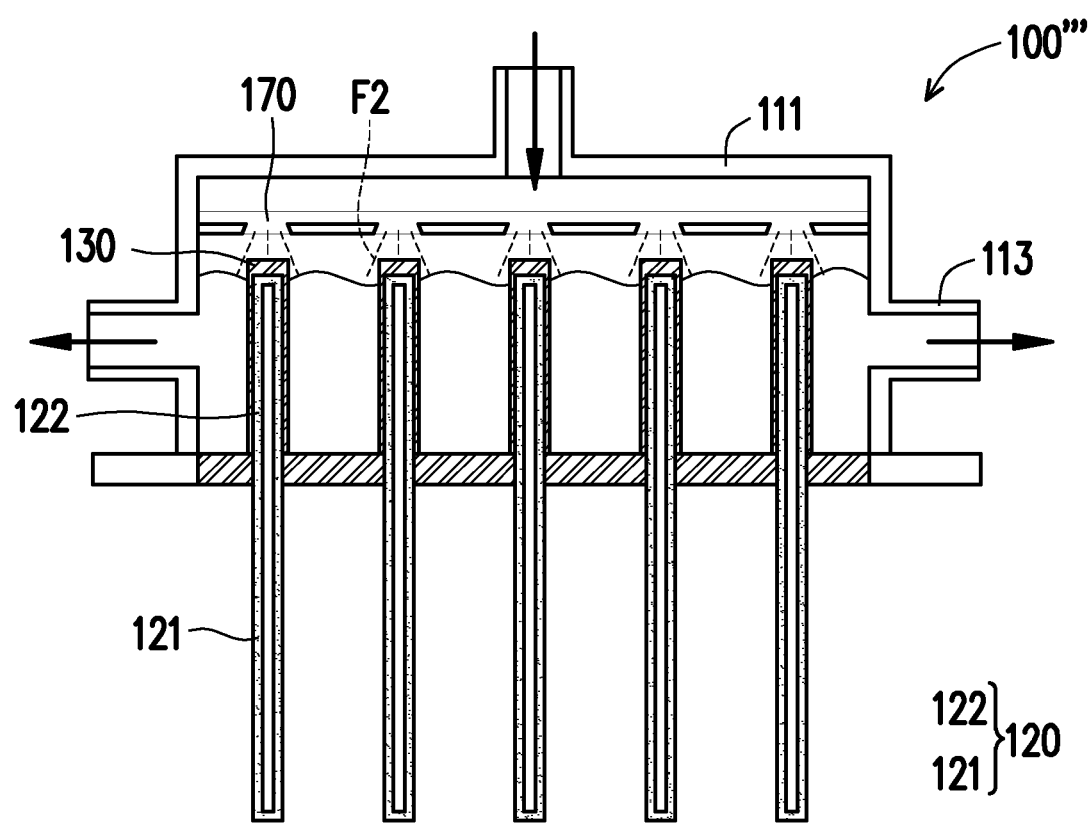
FIG. 9A is another variation of a radiator.

FIG. 9A is another variation of a radiator. Please refer to FIG. 9A. In an embodiment, a radiator 100''' further includes a sprinkler head 170 disposed above the inside of the second condensation tank 111, wherein the sprinkler head 170 sprays the second working fluid F2 at the second end 122 from above the heat exchanger part 120. Through the cooling design of directly spraying at or impacting the second end 122 of the heat exchanger part 120, the cooling effect can be more concentrated at the second end 122, ensuring that the second end 122 can be quickly cooled to enhance the heat dissipation effect.

Figure 9B:
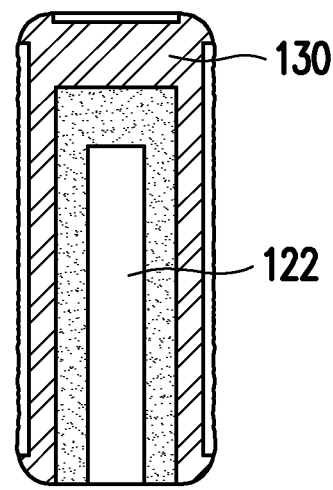
FIG. 9B is a schematic view of a sleeve member with surface roughness sleeved onto a second end of a heat exchanger part.

FIG. 9B is a schematic view of a sleeve member with surface roughness sleeved onto a second end of the heat exchanger part 120. Please refer to FIG. 9A and FIG. 9B at the same time. The sleeve member 130 sleeved onto the second end 122 has surface roughness, wherein the design of the sleeve member 130 with surface roughness can enhance the heat dissipation effect when a liquid flow passes through the second end 122. The liquid flow passing through the second end 122 referred to here includes the second working fluid F2 flowing from the cooling pipeline 113 and flowing out of the second condensation tank 111 and/or the second working fluid F2 sprayed toward the second end 122 from the sprinkler head 170. The sleeve member 130 may be made of a metal material with good heat dissipation.

Figure 10:
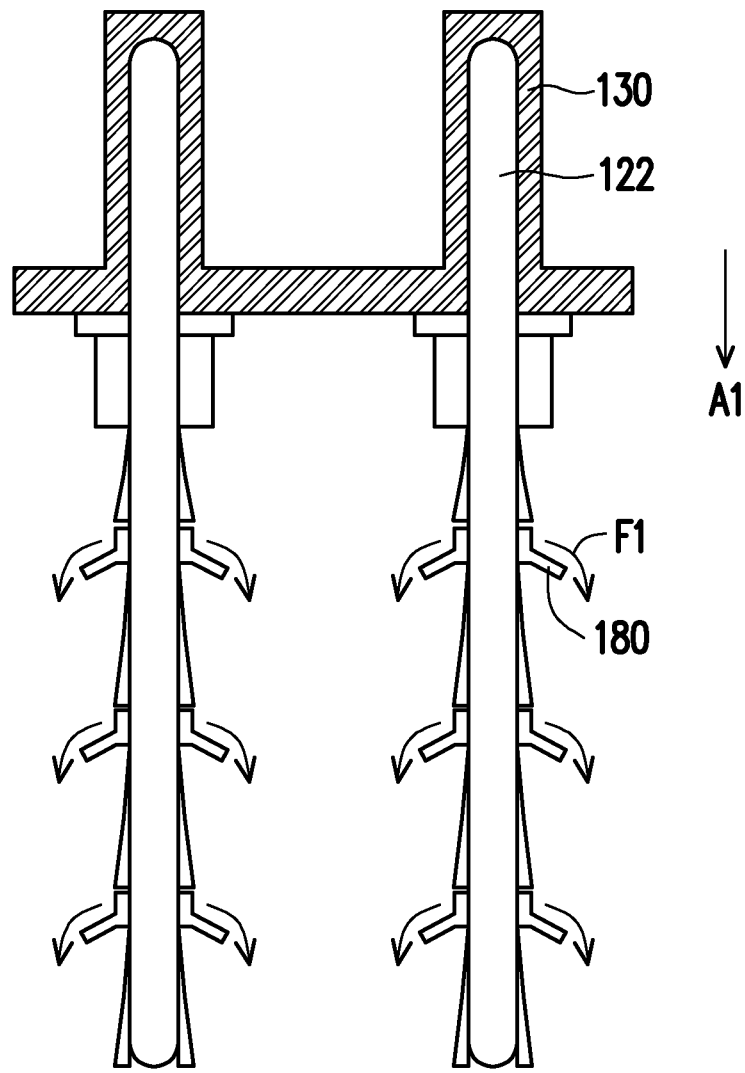
FIG. 10 is a schematic view of a water film disturber applied in a radiator.

FIG. 10 is a schematic view of a water film disturber applied in a radiator. As shown in FIG. 10, in an embodiment, the radiator 100 further includes multiple water film disturbers 180. The water film disturbers 180 are distributed on tube walls of the corresponding heat exchanger parts 120 along a direction of the tube walls of the heat exchanger parts 120 or the first direction A1. The water film disturber 180 may be used to block and destroy film layers formed by the first working fluid F1 on surfaces of the middle and the rear first end 121 of the heat exchanger part 120, thereby increasing the efficiency of heat exchange.

Figure 11A:
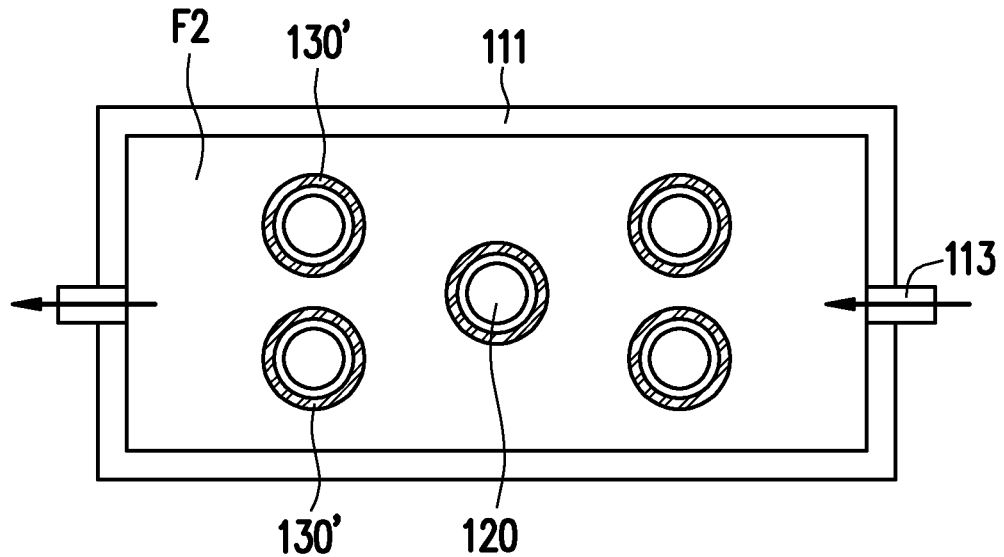
FIG. 11A and FIG. 11B are schematic views of a second end of a heat exchanger part covered with another sleeve member according to an embodiment.
Figure 11B:
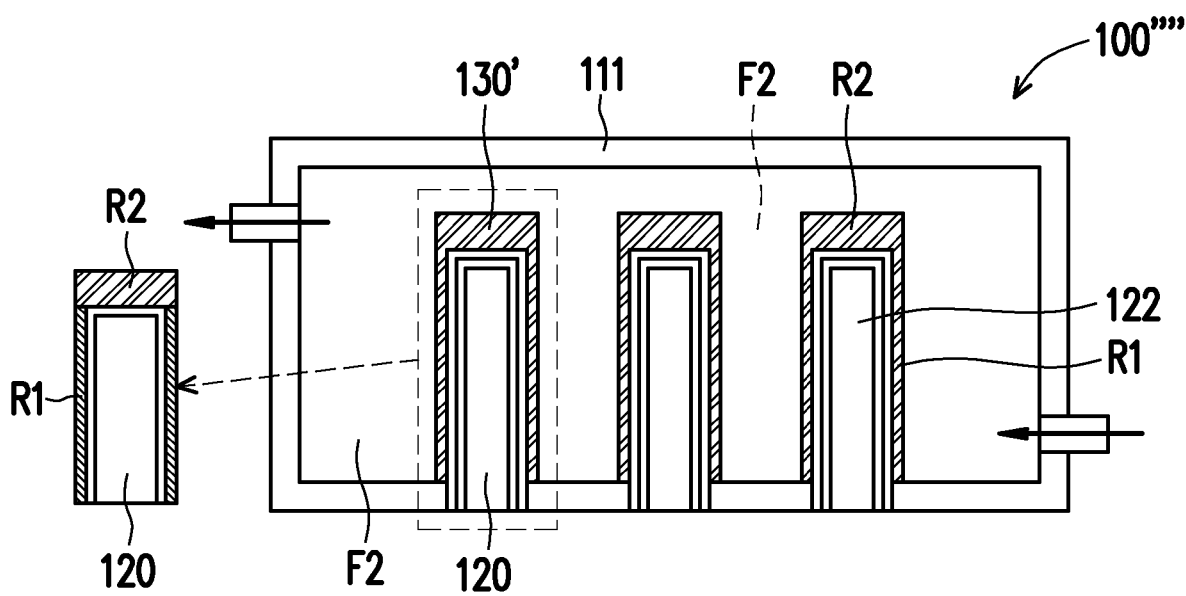

FIG. 11A and FIG. 11B are schematic views of a second end of a heat exchanger part covered with another sleeve member according to an embodiment. Please refer to FIG. 11A and FIG. 11B at the same time. A sleeve member 130' is made of a foam metal and has a dense foam region R1 and a loose foam region R2, wherein the dense foam region R1 is disposed around a circumferential surface of the second end 122, and the loose foam region R2 covers an end edge of the second end 122.

The density or the looseness of the foam regions is determined by comparing foam conditions of the two regions. Specifically, the foam structure of the loose foam region R2 is looser than the foam structure of the dense foam region R1, wherein the covering of the dense foam region R1 helps to improve the heat dissipation effect of the circumferential surface of the second end 122 of the heat exchanger part 120, and the loose foam region R2 covering the end edge of the second end 122 can further disturb the second working fluid F2 to enhance the convection effect of the second working fluid F2.

Therefore, the use of the sleeve member 130' can more effectively improve the overall heat dissipation effect of a radiator 100".

Figure 11C:
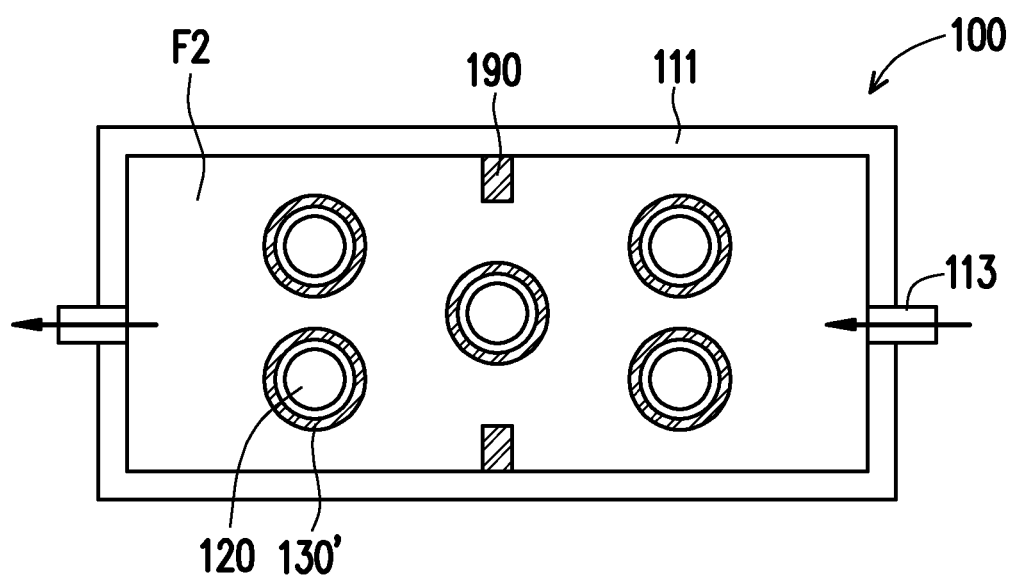
FIG. 11C is a schematic view of a radiator further including a foam metal partition.

FIG. 11C is a schematic view of a radiator further including a foam metal partition. In the embodiment shown in FIG. 11C, a partition 190 is further disposed in the second condensation tank 111, and the partition 190 may be made of a foam metal. The configuration of the partition 190 can change the flow field of the second working fluid F2 to create disturbance, thereby enabling a relatively uniform heat exchange between the sleeve member 130' and the second working fluid F2. In addition, the partition 190 is made of a foam metal and the partition 190 has multiple pores, so a situation where a fluid flows through the partition 190 and forms a fluid dead zone behind the partition 190 in the prior art can be prevented. The shape and the placement of the partition 190 are not limited to the rectangular upright shape shown in the drawing and may be appropriately designed according to requirements.

As can be seen from the above, the radiator of the disclosure may have various different implementations, all of which aim to further improve the heat dissipation effect. Therefore, it can be expected that persons skilled in the art have reasons to and can find ways to add or reduce components to the basic architecture of the radiator according to actual requirements under the technical revelations of the specification to obtain good heat dissipation effect.

In summary, in the radiator and the immersion tank using the radiator of the disclosure, a large amount of heat exchange work between systems can be performed by the boiling/evaporation behavior of the first working fluid together with the extremely high heat conduction efficiency of the heat exchanger part, so a dense pipeline is not required.

In addition, the first working fluid in the first condensation tank and the second working fluid in the second condensation tank only exchange heat with each other, and there is no physical liquid circulation exchange.

Furthermore, the heat exchanger part is selected as the heat pipe with a simple shape and structure or the flat heat pipe vapor chamber plate, which has advantages such as easy assembly and disassembly, and convenient maintenance and management. Furthermore, a damaged single heat exchanger part may be disassembled, assembled, and repaired without the need to disassemble the entire set, which is convenient for a user to disassemble, assemble, and repair and saves cost.

The inlet and outlet positions and the number of inlet and outlet pipes of the cooling pipeline are not limited to the schematic views and may be changed according to design requirements.

What is claimed is:

1. An immersion tank, comprising:
    a first condensation tank, wherein a plurality of motherboards and a first working fluid are located in the first condensation tank;
    a radiator, comprising:
        a condensation assembly, assembled outside the first condensation tank along a first direction, wherein the condensation assembly has a second condensation tank, and a second working fluid flows through the second condensation tank; and
        a plurality of heat exchanger parts, wherein each of the heat exchanger parts extends along the first direction, a first end of each of the heat exchanger parts is plugged into the first condensation tank, and a second end of each of the heat exchanger parts is plugged into the condensation assembly.

2. The immersion tank according to claim 1, wherein the first working fluid is a dielectric liquid and the second working fluid is water.

3. The immersion tank according to claim 1, wherein a boiling point of the first working fluid is between 20 and 80 degrees Celsius.

4. The immersion tank according to claim 1, wherein the condensation assembly further comprises a pump and a cooling pipeline, wherein the second condensation tank is connected to the cooling pipeline, and the pump is connected to the cooling pipeline.

5. The immersion tank according to claim 1, wherein the condensation assembly further comprises a vapor chamber cooling plate, and the heat exchanger parts are plugged into the vapor chamber cooling plate.

6. The immersion tank according to claim 5, wherein the vapor chamber cooling plate is a tank bottom of the second condensation tank.

7. The immersion tank according to claim 5, wherein the vapor chamber cooling plate is disposed between the first condensation tank and the second condensation tank.

8. The immersion tank according to claim 1, wherein the condensation assembly further comprises a vapor chamber cooling plate, and the first ends or the second ends of the heat exchanger parts are integrally formed with the vapor chamber cooling plate.

9. The immersion tank according to claim 1, wherein the heat exchanger part comprises a heat pipe, a vapor chamber plate, or a high thermal conductivity metal.

10. The immersion tank according to claim 1, wherein the radiator further comprises a plurality of fins, a normal direction of the fins is parallel to the first direction, and the heat exchanger parts are disposed passing through the fins.

11. The immersion tank according to claim 1, wherein the heat exchanger parts are arranged at intervals or misaligned with each other.

12. The immersion tank according to claim 1, wherein the radiator further comprises a sprinkler head disposed above the second condensation tank, and the sprinkler head sprays the second working fluid at the second end from above the heat exchanger part.

13. The immersion tank according to claim 1, wherein the radiator further comprises a plurality of sleeve members disposed in the second condensation tank, and the second ends of the heat exchanger parts are sleeved into the corresponding sleeve members.

14. The immersion tank according to claim 13, wherein the sleeve members have surface roughness.

15. The immersion tank according to claim 14, wherein the radiator further comprises a thermal interface material disposed between the sleeve member and the heat exchanger part sleeved with each other.

16. The immersion tank according to claim 1, wherein the radiator further comprises a plurality of fixing rings, and the heat exchanger parts pass through the corresponding fixing rings to be fixed to the second condensation tank.

17. The immersion tank according to claim 1, wherein the radiator further comprises a plurality of water film disturbers, and the water film disturbers are distributed on the corresponding heat exchanger parts along the first direction.

18. A radiator, adapted to be assembled in a first condensation tank of an immersion tank along a first direction, the radiator comprising:
 a condensation assembly, having a second condensation tank and a working fluid flowing through the second condensation tank; and
 a plurality of heat exchanger parts, wherein each of the heat exchanger parts extends along the first direction, a first end of each of the heat exchanger parts is adapted to be plugged into the first condensation tank, and a second end of each of the heat exchanger parts is plugged into the condensation assembly.

19. The radiator according to claim 18, wherein the working fluid is water.

20. The radiator according to claim 18, wherein the condensation assembly further comprises a pump and a cooling pipeline, wherein the second condensation tank is connected to the cooling pipeline, and the pump is connected to the cooling pipeline.

21. The radiator according to claim 18, wherein the condensation assembly further comprises a vapor chamber cooling plate, and the heat exchanger parts are plugged into the vapor chamber cooling plate.

22. The radiator according to claim 21, wherein the vapor chamber cooling plate is a tank bottom of the second condensation tank.

23. The radiator according to claim 18, wherein the condensation assembly further comprises a vapor chamber cooling plate, and the first ends or the second ends of the heat exchanger parts are integrally formed with the vapor chamber cooling plate.

24. The radiator according to claim 18, wherein the heat exchanger part comprises a heat pipe, a vapor chamber plate, or a high thermal conductivity metal.

25. The radiator according to claim 18, further comprising a plurality of fins, wherein a normal direction of the fins is parallel to the first direction, and the heat exchanger parts are disposed passing through the fins.

26. The radiator according to claim 18, wherein the heat exchanger parts are arranged at intervals or misaligned with each other.

27. The radiator according to claim 18, further comprising a sprinkler head disposed above the second condensation tank, wherein the sprinkler head sprays the second working fluid at the second end from above the heat exchanger part.

28. The radiator according to claim 18, further comprising a plurality of sleeve members disposed in the second condensation tank, wherein the second ends of the heat exchanger parts are sleeved into the corresponding sleeve members.

29. The radiator according to claim 28, wherein the sleeve members have surface roughness.

30. The radiator according to claim 29, further comprising a thermal interface material disposed between the sleeve member and the heat exchanger part sleeved with each other.

31. The radiator according to claim 18, further comprising a plurality of fixing rings, wherein the heat exchanger parts pass through the corresponding fixing rings to be fixed to the second condensation tank.

32. The radiator according to claim 18, further comprising a plurality of water film disturbers, wherein the water film disturbers are distributed on the corresponding heat exchanger parts along the first direction.

* * * * *